United States Patent
Wang et al.

(10) Patent No.: US 8,144,270 B2
(45) Date of Patent: Mar. 27, 2012

(54) COLOR FILTER DEVICE AND METHOD FOR FABRICATING THE SAME

(75) Inventors: Kuan-Hsiung Wang, Kaohsiung (TW); Yi-Tyng Wu, Chia-I (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 233 days.

(21) Appl. No.: 12/552,297

(22) Filed: Sep. 2, 2009

(65) Prior Publication Data
US 2011/0051054 A1    Mar. 3, 2011

(51) Int. Cl.
G02F 1/1335 (2006.01)
G02F 1/13 (2006.01)

(52) U.S. Cl. .................. 349/7; 349/106; 349/187
(58) Field of Classification Search ............. 349/5–10, 349/106–109
See application file for complete search history.

(56) References Cited

U.S. PATENT DOCUMENTS
5,453,406 A   9/1995  Chen
7,121,669 B2  10/2006  Iisaka
2002/0149720 A1*  10/2002  Janssen et al. ............ 349/113
2004/0257541 A1*  12/2004  Iisaka ............................ 353/84
2008/0017945 A1    1/2008  Wu
2008/0291373 A1*  11/2008  Liu ............................. 349/106
2009/0257006 A1*  10/2009  Ko et al. ...................... 349/106

OTHER PUBLICATIONS

Kenneth A Pietrzak et al., "Automatic Vision-Based Measurement of Newton Fringes", 2001, p. 1-4.
Tibor Balogh, "Holographic 3D visualization, development of the next generation holo-display based on emerging optical and optoelectronic technologies", Mar. 25, 2005, p. 1-32.

* cited by examiner

Primary Examiner — Mark Robinson
Assistant Examiner — Michael Inadomi
(74) Attorney, Agent, or Firm — Winston Hsu; Scott Margo

(57) ABSTRACT

A liquid crystal on silicon (LCoS) panel is disclosed. The LCoS panel includes: a substrate having at least one metal-oxide semiconductor (MOS) transistor thereon; a pixel electrode array disposed on the substrate; a plurality of color filters with at least two different colors disposed on the pixel electrode array, wherein adjacent color filters comprise a gap therebetween and at least two of the color filters are not coplanar; an inorganic film disposed on the color filters and within the gap; and an organic film covering the inorganic film entirely.

13 Claims, 4 Drawing Sheets

COLOR FILTER DEVICE AND METHOD FOR FABRICATING THE SAME

BACKGROUND OF THE INVENTION

1. Field of the Invention

The invention relates to a color filter device, and more particularly, to a LCoS panel having inorganic film and organic film disposed on a color filter array.

2. Description of the Prior Art

With the trend toward digital age, the development of display technique and change of broadcasting method that adopts digital signals have made kinds of flat display such as liquid crystal display (LCD), field emission display (FED), organic light emitting diode (OLED), and plasma display panel (PDP) more preferable than conventional cathode ray tube (CRT).

Furthermore, since the micro-display is able to provide larger images than aforementioned displays are by optical method, the micro-display is more preferred on demand for displaying ultra large-sized images. The micro-display possesses another advantage of being easily applied in different displays such as LCD or OLED. For example, the micro-display applied in LCD is so-called micro LCD panel. The micro-display is divided into two categories: transmissive and reflective. The transmissive micro LCD panel is constructed on a glass substrate, and lights are transmitted through the display panel. The reflective micro LCD panel is constructed on a silicon substrate, therefore it is also known as liquid crystal on silicon display panel (LCoS) panel. The LCoS panel not only adopts the silicon wafer as the substrate but also replaces the thin film transistors (TFTs) with MOS transistors. Furthermore, the LCoS panel uses metal material serving as pixel electrode, thus light is reflected.

Both transmissive and reflective micro-displays need color filter array. Conventional means for fabricating a color filter array preferably involves the steps of forming a plurality of color filters with different colors, covering a material layer composed of tetraethoxysilane (TEOS) on top of the color filters, and using a chemical mechanical polishing (CMP) process to planarize the aforementioned material layer. Unfortunately, the planarizing step of using aforementioned CMP process still causes uneven height on the color filter array and results in problem such as discoloration and Newton ring on the image of the display.

SUMMARY OF THE INVENTION

It is an objective of the present invention to provide a LCoS panel and method for fabricating the same to solve the aforementioned problems.

According to a preferred embodiment of the present invention, a liquid crystal on silicon (LCoS) panel is disclosed. The LCoS panel includes: a substrate having at least one metal-oxide semiconductor (MOS) transistor thereon; a pixel electrode array disposed on the substrate; a plurality of color filters with at least two different colors disposed on the pixel electrode array, wherein adjacent color filters comprise a gap therebetween and at least two of the color filters are not coplanar; an inorganic film disposed on the color filters and within the gap; and an organic film covering the inorganic film entirely.

It is another aspect of the present invention to provide a method for fabricating a liquid crystal on silicon (LCoS) panel. The method includes the steps of: providing a substrate having at least one MOS transistor thereon; forming a pixel electrode array on the substrate; forming a plurality of color filters with at least two different colors on the pixel electrode array, wherein adjacent color filters comprise a gap therebetween and at least two of the color filters are not coplanar; forming an inorganic film on the color filters and within the gap; and forming an organic film on the inorganic film entirely.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
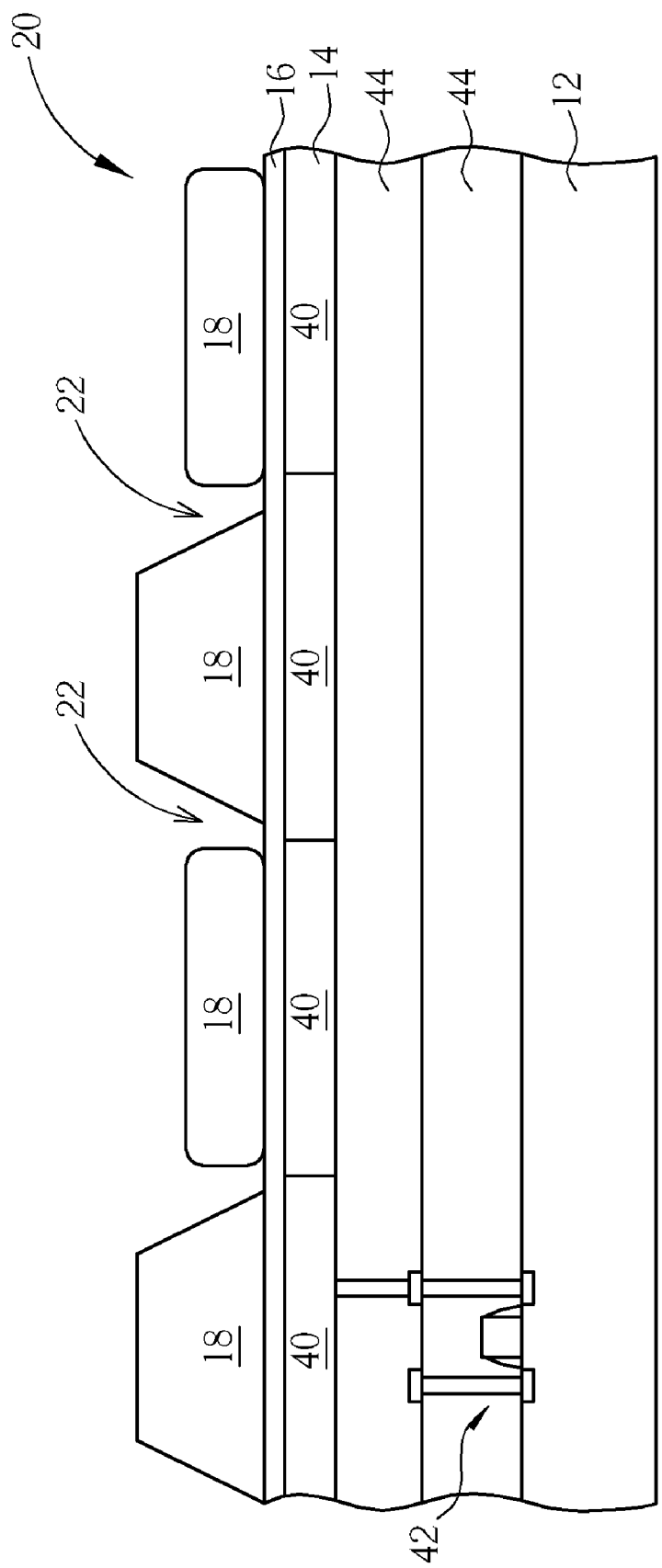
FIGS. 1-4 illustrate a method for fabricating a liquid crystal on silicon (LCoS) panel according to a preferred embodiment of the present invention.

Referring to FIGS. 1-4, FIGS. 1-4 illustrate a method for fabricating a liquid crystal on silicon (LCoS) panel according to a preferred embodiment of the present invention. As shown in FIG. 1, a semiconductor substrate 12, such as a silicon substrate is provided, and a pixel electrode layer 14 arranged according to a matrix, a reflective layer 16, and a color filter array 20 composed of a plurality of color filters 18 is formed sequentially on the semiconductor substrate 12. At least one metal oxide semiconductor (MOS) transistor 42, such as CMOS transistor fabricated from standard transistor fabrication is disposed on the semiconductor substrate 12 to drive the pixel electrode within the pixel electrode layer 14, and an interlayer dielectric layer 44 is disposed on the MOS transistor 42. Each pixel electrode in the pixel electrode layer 14 could be an independent metal layer composed of aluminum, and the reflective layer 16 formed selectively could be a dielectric layer composed of high reflectivity covering the surface of each pixel electrode, or a metal layer disposed corresponding to the surface of each pixel electrode for reflecting lights filtered from the color filters 18. Fabrication of the color filter array 20 preferably includes the steps of first forming a single colored filter layer (not shown) on the semiconductor substrate, and performing a pattern transfer process on this filter layer. The pattern transfer process includes etching the deposited filter layer by using a patterned photoresist as mask to form a color filter 18 on the semiconductor substrate 12. Deposition and pattern transfer of the filter layer are conducted repeatedly to form a color filter array 20 composed of plurality of color filters 18 with different colors or different wavelengths on the semiconductor substrate 12. In this embodiment, the color filter 18 is preferably composed of organic chemical material capable of filtering lights, such as a mixture of acrylic resin and different colored pigment or dye. The color filters 18 of this present invention could also be red color filter, green color filter, blue color filter, or combination thereof, and the colors of the color filters 18 is not limited thereto. A plurality of gaps 22 is also formed between the color filters 18 after the pattern transfer process, and at least two of the color filters 18 are not coplanar.

Figure 2:
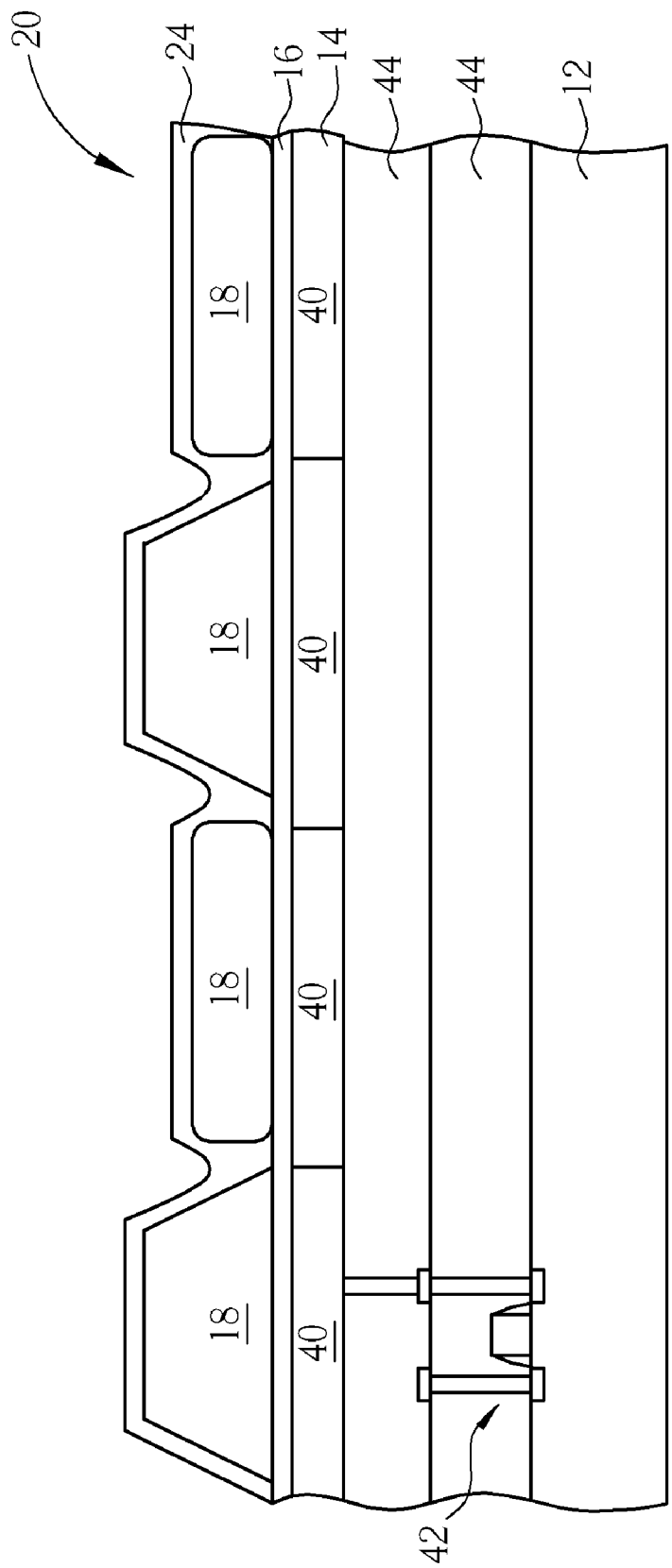

As shown in FIG. 2, an organic film 24 is formed entirely on the color filters 18 and filling the gaps 22 between the color filters 18. In this embodiment, the inorganic film 24 is preferably formed through a spin coating process, but not limited thereto. A plasma-enhanced chemical vapor deposition (PECVD) process could also be conducted to fabricate this inorganic film 24. The inorganic film 24 is selected from at least one of spin on glass (SOG) film, field oxide spin-onglass (FOX SOG) film, plasma-enhanced oxide (PE-oxide), tetraethoxysilane (TEOS), or combination thereof. The thickness of the inorganic film 24 is between 2100 angstroms to 3100 angstroms, and preferably at 2600 angstroms.

Figure 3:
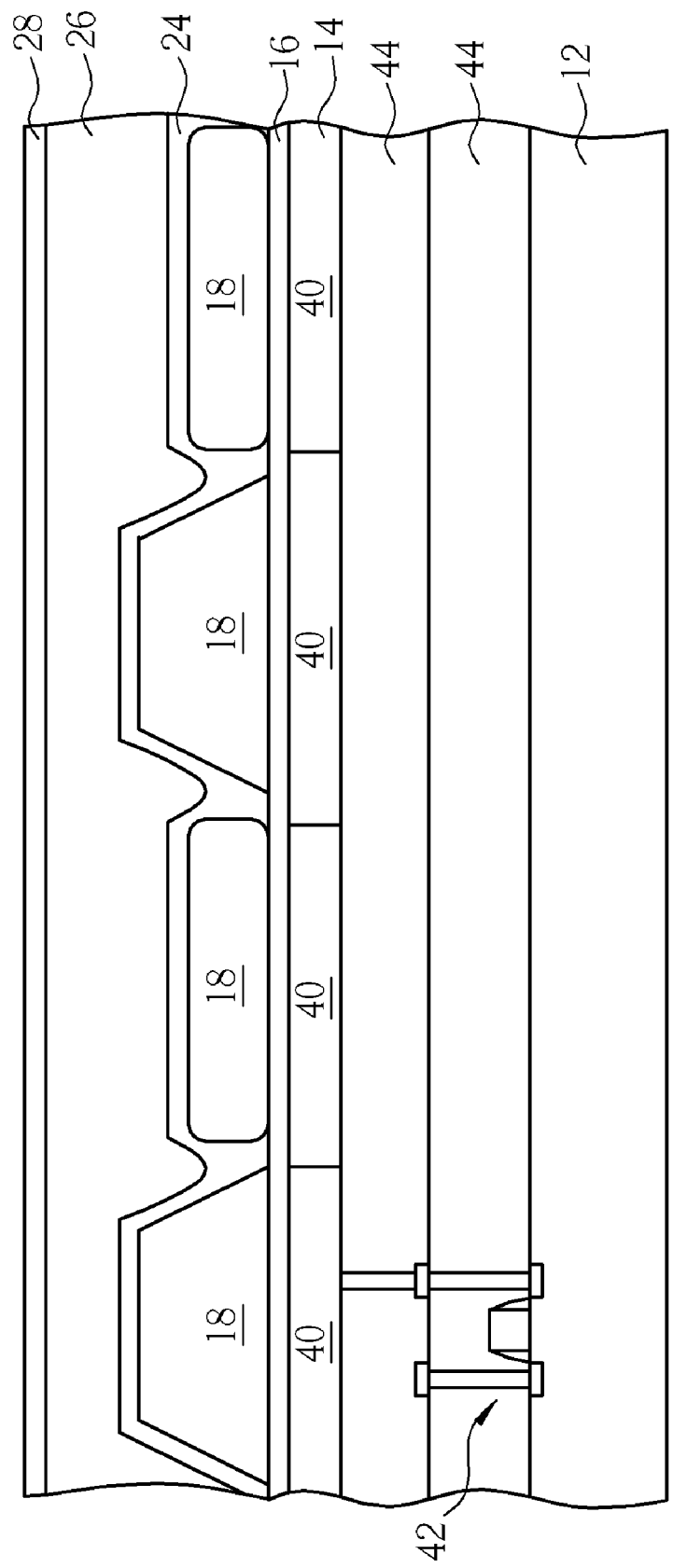

As shown in FIG. 3, an organic film 24 is formed entirely on surface of the inorganic film 24. In this embodiment, the organic film 26 is composed of negative type photoresist, which could be selected from at least one of planar photoresist, buffer layer photoresist, or combination thereof. The thickness of the organic film 26 is preferably fives times more than the thickness of the inorganic film 24, such as between 10000 angstroms to 12000 angstroms, and preferably at 11000 angstroms. A bottom alignment film 28 is then formed on the organic film 26 to finish the fabrication of a bottom substrate of the LCoS panel. By using the planarizing effect created from the inorganic film 24 and the organic film 26, the present invention could overcome shortcomings of using conventional CMP process to planarize films on top of the color filter, thereby resolving issues such as discoloration and Newton ring on the displayed images.

Figure 4:
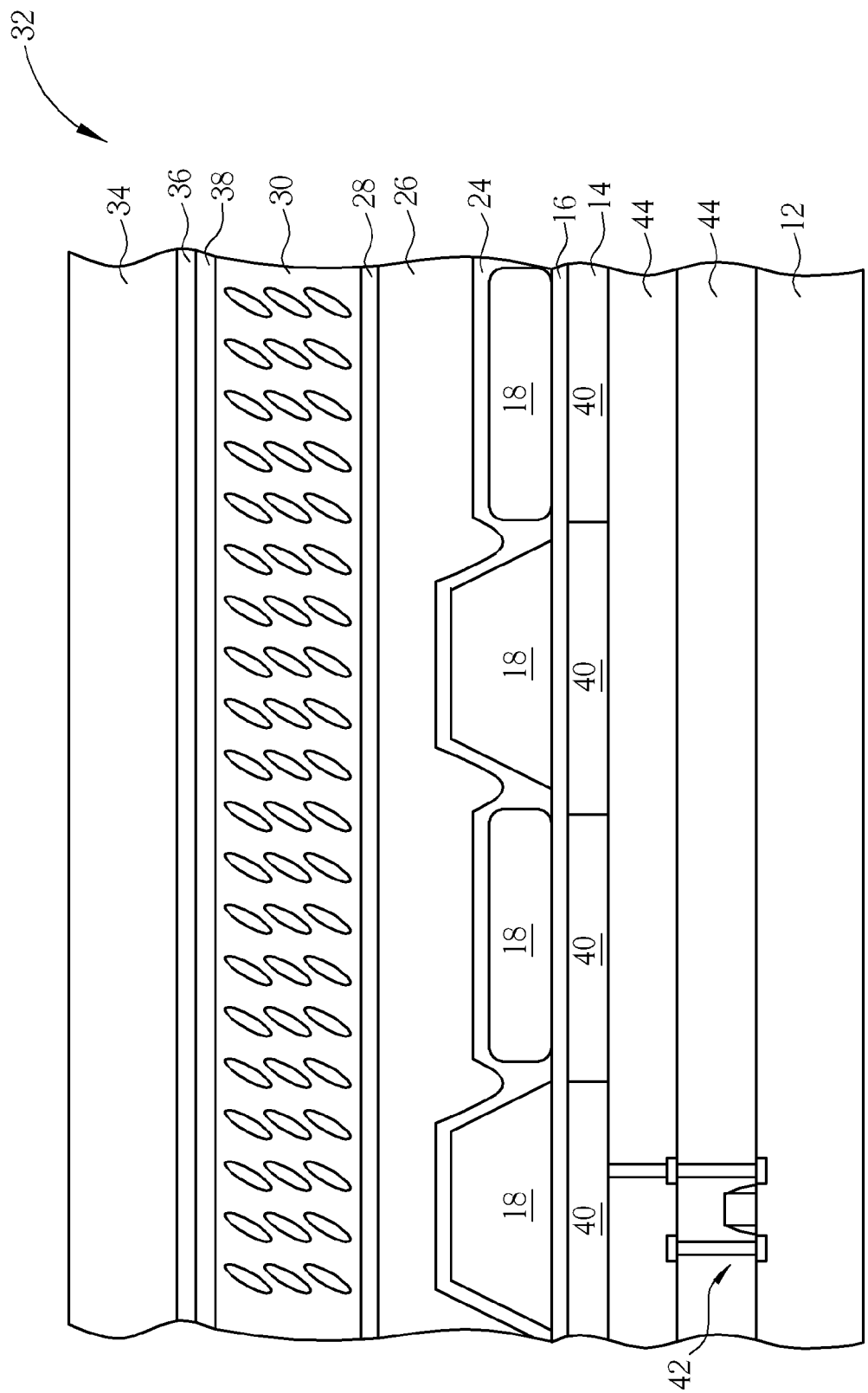

As shown in FIG. 4, a liquid crystal layer 30 and a top substrate 32 is fabricated on the bottom substrate containing the color filter array 20, in which the top substrate 32 preferably includes a substrate 34, a transparent conductive layer 36, and a top alignment film 38 disposed on lower surface of the substrate 34. The substrate 34 is a transparent substrate, such as a glass substrate or a quartz substrate. The transparent conductive layer 36 is selected from transparent conductive oxides (TCO) consisting of indium tin oxide (ITO), indium zinc oxide, (IZO), indium tin zinc oxide (ITZO), aluminum zinc oxide (AZO), zirconium zinc oxide (ZZO) and gallium zinc oxide (GZO). The top alignment film 38 and the bottom alignment film 28 are disposed to control the aligning direction of liquid crystal molecules within the liquid crystal layer 30. This completes the fabrication of a LCoS panel according a preferred embodiment of the present invention.

Referring back to FIG. 4, which further discloses a color filter device, and more specifically to a LCoS panel structure. As shown in FIG. 4, the LCoS panel includes a substrate 12, a plurality of color filters 18 disposed on the substrate 12, a plurality of gaps 22 formed between the color filters 18, an inorganic film 24 disposed on the color filters 18 entirely and filled in the gaps 22, an organic film 26 disposed on surface of the inorganic film 24 entirely, a bottom alignment film 28 disposed on the organic film 26, a liquid crystal layer 30 disposed on the bottom alignment film 28, and a top substrate 32 disposed on the liquid crystal layer 30. It should be noted that the substrate 12 is not limited to a silicon substrate, and the top substrate 32 is preferably composed of a transparent substrate 34 made of glass or quartz, a transparent conductive layer 36, and a top alignment film 38.

The color filters 18 could have different color or different range of wavelengths, including red color filters, green color filters, and blue color filters. The inorganic film 24 is selected from spin on glass (SOG) film, field oxide spin-on-glass (FOX SOG) film, plasma-enhanced oxide (PE-oxide), and tetraethoxysilane (TEOS), while the organic film 26 is composed of negative type photoresist, such as selected from planar photoresist and buffer layer photoresist. In this embodiment, the thickness of the inorganic film is between 2100 angstroms to 3100 angstroms, and preferably at 2600 angstroms, whereas the thickness of the organic film 26 is between 10000 angstroms to 12000 angstroms, and preferably at 11000 angstroms.

Despite the color filter array 20 having plurality of color filters 18 is fabricated on the semiconductor substrate 12 in this embodiment, the color filter array 20 and the inorganic film 24 and organic film 26 thereon could also be fabricated on lower surface of the top substrate 32. For instance, the color filter array 20 could be formed on a transparent substrate including glass substrate or quartz substrate instead of on the silicon substrate having MOS transistors thereon, which is also within the scope of the present invention.

Overall, the present invention first uses a spin coating process to cover an inorganic film on surface of a color filter array with plurality of filters and within the gaps between the color filters, and then deposits an organic film on surface of the inorganic film entirely. By using the planarizing effect brought by these two films, the present invention could lower the cost and fabrication time of the LCoS panel and also improve the optical performance of the panel significantly.

Those skilled in the art will readily observe that numerous modifications and alterations of the device and method may be made while retaining the teachings of the invention.

What is claimed is:

1. A color filter device, comprising:
   a substrate having at least one metal-oxide semiconductor (MOS) transistor thereon;
   a pixel electrode array disposed on the substrate;
   a plurality of color filters with at least two different colors disposed on the pixel electrode array, wherein adjacent color filters comprise a gap therebetween and at least two of the color filters have different height;
   an inorganic film disposed on the color filters and within the gap; and
   an organic film covering the inorganic film entirely, wherein the organic film is selected from planar photoresist and buffer layer photoresist.

2. The color filter device of claim 1, wherein the color filters comprise red color filters, green color filters or blue color filters.

3. The color filter device of claim 1, wherein the inorganic film is selected from spin on glass (SOG) film, field oxide spin-on-glass (FOX SOG) film, plasma-enhanced oxide (PE-oxide), and TEOS.

4. The color filter device of claim 1, wherein the organic film comprises negative type photoresist.

5. The color filter device of claim 1, wherein the thickness of the inorganic film is between 2100 angstroms to 3100 angstroms.

6. The color filter device of claim 1, wherein the thickness of the organic film is between 10000 angstroms to 12000 angstroms.

7. A method for fabricating a color filter device, comprising:
   providing a substrate having at least one MOS transistor thereon;
   forming a pixel electrode array on the substrate;
   forming a plurality of color filters with at least two different colors on the pixel electrode array, wherein adjacent color filters comprise a gap therebetween and at least two of the color filters have different height;
   forming an inorganic film on the color filters and within the gap; and
   forming an organic film on the inorganic film entirely, wherein the organic film is selected from planar photoresist and buffer layer photoresist.

8. The method of claim 7, wherein the color filters comprise red color filters, green color filters, or blue color filters.

9. The method of claim 7, further comprising performing a spin coating process for forming the inorganic film.

10. The method of claim 7, wherein the inorganic film is selected from spin on glass (SOG) film, field oxide spin-on-glass (FOX SOG) film, plasma-enhanced oxide (PE-oxide), and TEOS.

11. The method of claim 7, the organic film comprises negative type photoresist.

12. The method of claim 7, wherein the thickness of the inorganic film is between 2100 angstroms to 3100 angstroms.

13. The method of claim 7, wherein the thickness of the organic film is between 10000 angstroms to 12000 angstroms.

* * * * *